(12) United States Patent
Katagiri et al.

(10) Patent No.: US 7,714,424 B2
(45) Date of Patent: May 11, 2010

(54) STACKED-TYPE SEMICONDUCTOR PACKAGE

(75) Inventors: Mitsuaki Katagiri, Tokyo (JP); Atsushi Hiraishi, Tokyo (JP); Fumiyuki Osanai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 212 days.

(21) Appl. No.: 12/081,264

(22) Filed: Apr. 14, 2008

(65) Prior Publication Data

US 2008/0203584 A1    Aug. 28, 2008

Related U.S. Application Data

(62) Division of application No. 11/291,780, filed on Dec. 2, 2005, now Pat. No. 7,375,422.

(30) Foreign Application Priority Data

Dec. 3, 2004    (JP) .............................. 2004-350620

(51) Int. Cl.
 *H01L 23/02*    (2006.01)
(52) U.S. Cl. ..................... 257/686; 257/723; 257/737; 257/738; 257/E23.004; 257/E23.067; 257/E23.176; 257/E25.023
(58) Field of Classification Search ............... 257/686, 257/723, 737, 738, E23.004, E23.067, E23.178, 257/E25.023
See application file for complete search history.

(56) References Cited

U.S. PATENT DOCUMENTS

| | | | |
|---|---|---|---|
| 5,608,265 A | * | 3/1997 | Kitano et al. ............... 257/738 |
| 5,854,085 A | * | 12/1998 | Raab et al. .................. 438/123 |
| 6,294,837 B1 | | 9/2001 | Akram et al. |
| 6,473,308 B2 | | 10/2002 | Forthun |
| 2004/0227222 A1 | | 11/2004 | Kikuchi et al. |
| 2004/0262733 A1 | | 12/2004 | Kumamoto |
| 2005/0001302 A1 | | 1/2005 | Tanie et al. |
| 2005/0083742 A1 | | 4/2005 | Hwang et al. |
| 2005/0104181 A1 | | 5/2005 | Lee et al. |

FOREIGN PATENT DOCUMENTS

| | | |
|---|---|---|
| JP | 10-335580 | 12/1998 |
| JP | 11-220088 | 8/1999 |
| JP | 2003-133516 | 5/2003 |
| JP | 2003-338602 | 11/2003 |
| JP | 2004-282057 | 10/2004 |

OTHER PUBLICATIONS

Japanese Office Action, issued in Corresponding Japanese Patent Application No. 2004-350620, dated on Dec. 12, 2007.
English translation of relevant portion of Japanese Office Action, issued in Corresponding Japanese Patent Application No. 2004-350620, dated Dec. 12, 2007.

\* cited by examiner

*Primary Examiner*—Long K Tran
(74) *Attorney, Agent, or Firm*—McDermott Will & Emery LLP

(57) ABSTRACT

Corresponding parts to a first path portion in a first signal transmission path to a first semiconductor chip are an interconnection member and a second path portion a second signal transmission path to a second semiconductor chip and are not formed on the first tape. An electric length of the second signal transmission path is allowed to be adjusted independently of the first tape, so that the electric length of the second signal transmission path can be easily made equal to or substantially equal to that of the first signal transmission path.

1 Claim, 4 Drawing Sheets

STACKED-TYPE SEMICONDUCTOR PACKAGE

RELATED APPLICATIONS

This application is a Divisional of U.S. application Ser. No. 11/291,780, filed Dec. 2, 2005, now U.S. Pat. No. 7,375,422 claiming priority of Japanese Application No. 2004-350620, filed Dec. 3, 2004, the entire contents of each of which are hereby incorporated by reference.

BACKGROUND OF THE INVENTION

This invention relates to a stacked-type semiconductor package, and more particularly to a stacked-type DRAM package which has high data rate transfer capability.

To increase memory capacity of a memory device package without making its profile large, there have been employed multiple techniques for stacking a plurality of memory chips into a vertical chip stack. For example, known techniques are disclosed in JP-A H11-220088 and U.S. Pat. No. 6,473,308 B2, which are incorporated herein by reference in its entirety. JP-A H11-220088 provides a stackable chip package of a unique structure, in accordance with which a chip stack can be obtained simply by stacking the same structured packages in turn. U.S. Pat. No. 6,473,308 B2 provides a chip package including a flex circuit which allows multiple chip packages to be easily assembled into a chip stack. However, according to the above prior arts, stacked packages in a chip stack have different electric lengths of data paths.

To solve the problem of the different electric lengths on stacked packages, US 2004/0227222 A1 has disclosed a four-layer substrate or tape comprising four conductive layers, which provides almost the same electric lengths to semiconductor chips mounted on the opposite surfaces of the tape. However, the four-layer tape is more expensive than a two-layer tape of normal one and increases a cost of a staked-type semiconductor package.

Therefore, there is a need for another technique of a staked-type semiconductor package which allows electric lengths of packages to be substantially equal to each other.

SUMMARY OF THE INVENTION

According to an aspect of the present invention, a stacked-type semiconductor package comprises an external connection terminal, a first semiconductor chip, a first tape, an interconnection member, a second semiconductor chip, and a second tape. Mounted on the first tape is the first semiconductor chip, while mounted on the second tape is the second semiconductor chip. The first tape is formed with a common path portion and a first path portion; the common path portion extends from the external connection terminal to a diverging point; and the first path portion extends from the diverging point to the first semiconductor chip. The interconnection member is connected to the diverging point. The second tape is formed with a second path portion which extends from the interconnection member to the second semiconductor chip.

The common path portion and the first path portion constitute a first signal transmission path to the first semiconductor chip, while the common path portion, the interconnection member and the second path portion constitute a second signal transmission path to the second semiconductor chip. Because the common path portion is shared by the first signal transmission path and the second signal transmission path, the corresponding parts to the first path portion are the interconnection member and the second path portion, which are not formed on the first tape. Therefore, an electric length of the second signal transmission path is allowed to be adjusted independently of the first tape, so that the electric length of the second signal transmission path can be easily made equal to or substantially equal to that of the first signal transmission path.

An appreciation of the objectives of the present invention and a more complete understanding of its structure may be had by studying the following description of the preferred embodiment and by referring to the accompanying drawings.

DESCRIPTION OF PREFERRED EMBODIMENTS

Figure 1:
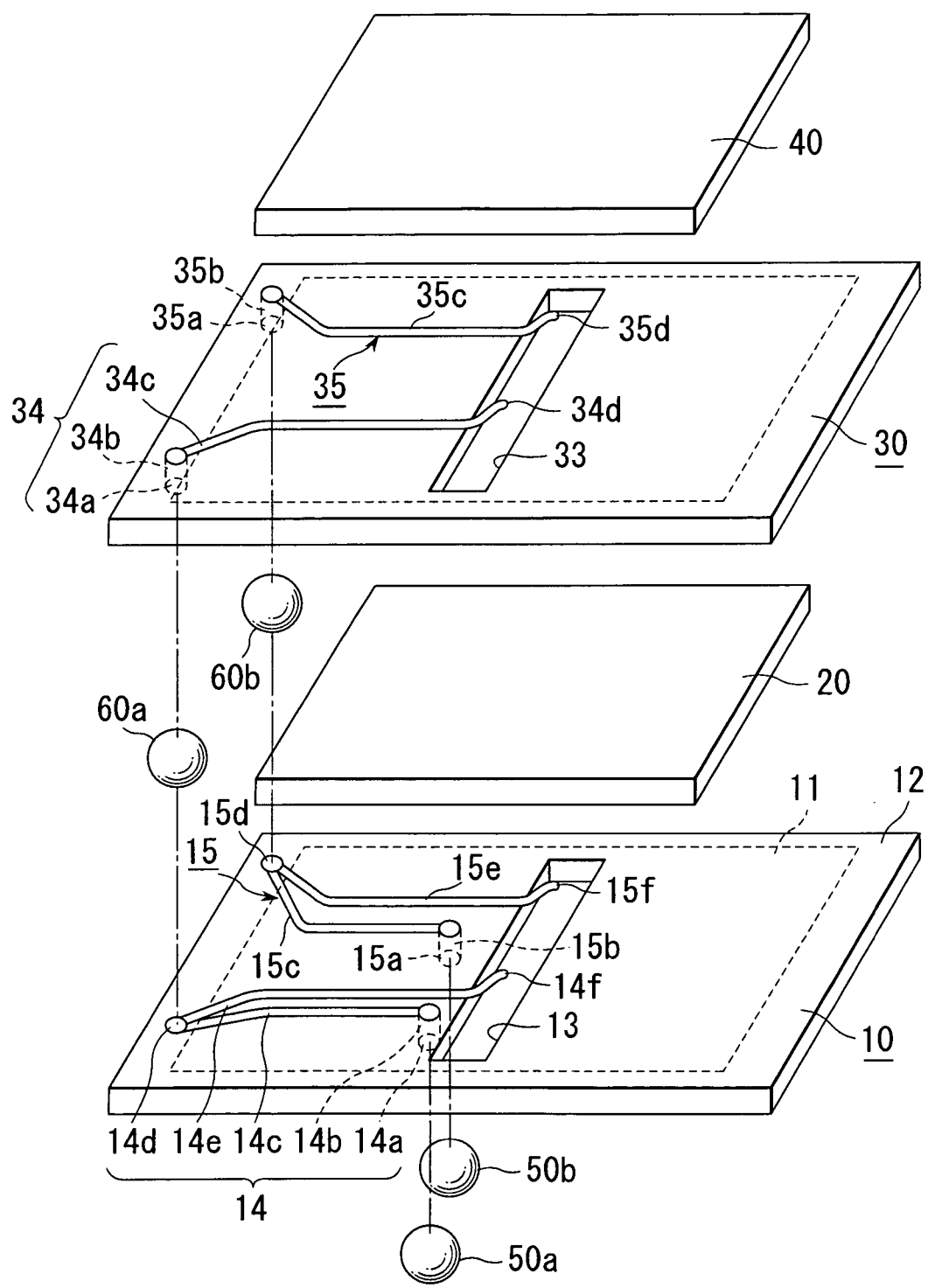
FIG. 1 is an exploded, perspective view schematically showing a stacked-type semiconductor package according to an embodiment of the present invention, wherein some components including elastomer sheets are not shown for the sake of clarity.
Figure 2:
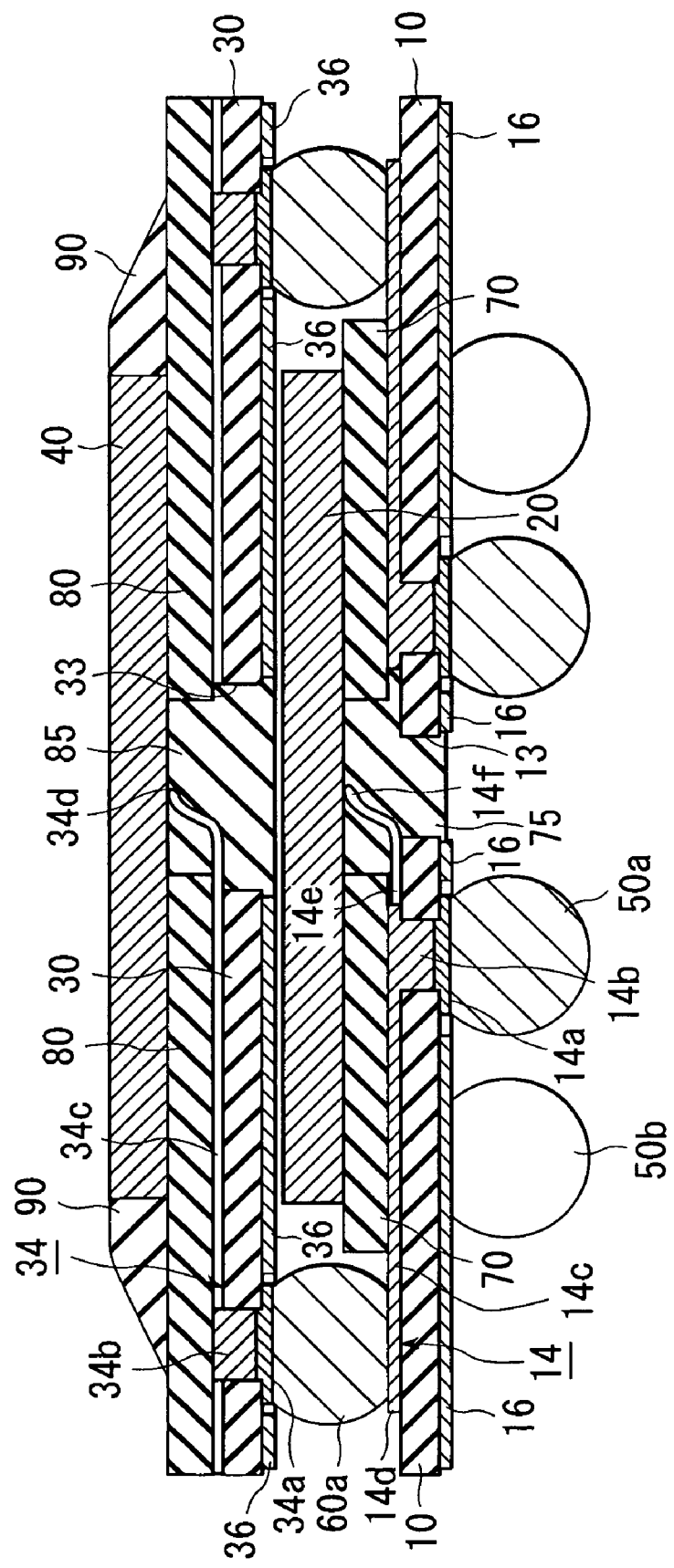
FIG. 2 is a cross-sectional view schematically showing the stacked-type semiconductor package of FIG. 1, wherein some components, especially right-side components are not shown for the sake of clarity.

As shown in FIGS. 1 and 2, a stacked-type semiconductor package according to a embodiment of the present invention comprises a first tape 10, a first semiconductor chip 20, a second tape 30, a second semiconductor chip 40, first solder balls 50a, 50b and second solder balls 60a, 60b, wherein the first solder balls 50a, 50b serve as external connection terminals which are to be connected to an external object such as a printed circuit board of a memory module, and the second solder balls 60a, 60b serve as interconnection terminals for interconnecting semiconductor chips. The illustrated stacked-type semiconductor package is a BGA (ball grid array) package. In this embodiment, the first and the second semiconductor chips 20, 40 are DRAM chips which have the same structure, and the stacked-type semiconductor chip is a stacked-type DRAM package. However, the present invention is not limited thereto and may be applied to another kind of semiconductor chips and another kind of semiconductor package.

The first and the second semiconductor chips 20, 40 shown in FIGS. 1 and 2 have the same structure with center pad configuration. The first semiconductor chip 20 has a plurality of bonding pads which are positioned on a center area of the first semiconductor chip 20. Likewise, the second semiconductor chip 40 has a plurality of bonding pads which are positioned on a center area of the second semiconductor chip 40. In this embodiment, the bonding pads of the first and the second semiconductor chips 20, 40 are lined up in the respective center rows.

The first tape 10 comprises a chip mount section 11 and an outer section 12 positioned outside the chip mount section 11. As apparent from FIGS. 1 and 2, the first semiconductor chip 20 is mounted on the chip mount section 11 through an elastomer sheet 70, which serves as a shock absorber or buffer. The illustrated chip mount section 11 is defined larger than the bottom area of the first semiconductor chip 20 in consideration of the size of the elastomer sheet 70.

The illustrated first tape 10 comprises a first base formed with a plurality of transmission lines 14, 15, each of which comprises a wire and a conductive via, wherein the first base is a polyimide film, and the wire of each transmission line 14, 15 is made of copper. In FIGS. 1 and 2, although only one or two transmission lines 14, 15 are shown for the sake of clarity, the actual first tape 10 has more transmission lines. By forming the wires on the polyimide film, followed by forming a center window 13 therein, the wires of the transmission lines 14, 15 have the respective free ends 14f, 15f. The free ends 14f, 15f are to be bonded to the bonding pads of the first semiconductor chip 20.

The transmission lines 14, 15 are generally formed on a top surface of the first base although parts of the transmission lines 14, 15 reach a bottom surface of the first base, as described in detail afterwards. On the bottom surface except a first predetermined area, a first reference plane 16 is formed. In other words, the first reference plane 16 generally covers the bottom surface but does not cover the first predetermined area. In this embodiment, the first reference plane 16 is made of copper.

The first reference plane 16 is supplied with a referential voltage such as a ground voltage upon its actual use. Together with the first reference plane 16, each of the transmission lines 14, 15 constitutes a microstrip transmission line structure so that each of the transmission lines 14, 15 has high transmission reliability.

The transmission line 14 comprises a ball land 14a, a conductive via 14b, a wire portion 14c, another ball land 14d, and another wire portion 14e. The ball land 14a is formed on the bottom surface of the first base and is positioned within the first predetermined area of the first base so as to be electrically isolated from the first reference plane 16. The conductive via 14b is connected to the ball land 14a and extends to the top surface of the first base. The wire portion 14c extends from the conductive via 14b to the ball land 14d. The wire portion 14e extends from the ball land 14d to the free end 14f Connected to the ball land 14a is the first solder ball 50a, while connected to the ball land 14d is the second solder ball 60a. The free end 14f is connected to the bonding pad of the first semiconductor chip 20 and is protected by a resin protector 75. The ball land 14a, the conductive via 14b, the wire portion 14c, and the ball land 14d constitute a common path portion which is shared by the first and the second semiconductor chips 20, 40. On the other hand, the wire portion 14e constitutes a first path portion which is used only as a part of a first signal transmission path to the first semiconductor chip. The ball land 14d serves as a diverging point at which the common path portion branches off.

The transmission line 15 comprises a ball land 15a, a conductive via 15b, a wire portion 15c, another ball land 15d, another wire portion 15e and the free end 15f, similar to the ball land 14a, the conductive via 14b, the wire portion 14c, the ball land 14d, the wire portion 14e and the free end 14f of the transmission line 14.

The arrangement of the first solder balls 50a, 50b of the external connection terminals is defined and standardized, for example, by JEDEC (Joint Electron Device Engineering Council). Therefore, the arrangement of the ball lands 14a, 15a is compliant with the definition and standard. On the other hand, the second solder balls 60a, 60b of the interconnection members are not restricted to the standard and definition but may be arranged in accordance with a unique arrangement. Therefore, the ball lands 14d, 15d of the diverging points may be arranged without restriction of the standard and definition.

As apparent from FIG. 1, the ball lands 14d, 15d of the diverging points are positioned on the outer section 12, on which the first semiconductor chip 20 is not mounted. Therefore, the second solder balls 60a, 60b of the interconnection members can be directly positioned on the respective ball lands 14, 15.

The illustrated second tape 30 comprises a second base formed with a plurality of transmission lines 34, 35, each of which comprises a wire and a conductive via, wherein the second base is a polyimide film formed with a center window 33, and the wire of each transmission line 34, 35 is made of copper. In FIGS. 1 and 2, although only one or two transmission lines 34, 35 are shown for the sake of clarity, the actual second tape 30 has more transmission lines.

The transmission lines 34, 35 are generally formed on a top surface of the second base although parts of the transmission lines 34, 35 reach a bottom surface of the second base, as described in detail afterwards. On the bottom surface except a second predetermined area, a second reference plane 36 is formed. In other words, the second reference plane 36 generally covers the bottom surface but does not cover the second predetermined area. In this embodiment, the second reference plane 36 is made of copper.

The second reference plane 36 is supplied with the referential voltage upon its actual use. Together with the second reference plane 36, each of the transmission lines 34, 35 constitutes a microstrip transmission line structure so that each of the transmission lines 34, 35 has high transmission reliability.

The transmission line 34 comprises a ball land 34a, a conductive via 34b, and a wire portion 34c. The ball land 34a is formed on the bottom surface of the second base and is positioned within the second predetermined area of the second base so as to be electrically isolated from the second reference plane 36. The conductive via 34b is connected to the ball land 34a and extends to the top surface of the second base. The wire portion 34c extends from the conductive via 34b into the center window 33 of the second base and has a free end 34d which is bonded to the bonding pad of the second semiconductor chip 40 and is protected by a resin protector 85. Mounted on the ball land 34a is the second solder ball 60a. The transmission line 34 and the second solder ball 60a constitute a second path portion which is used only as a part of a second signal transmission path to the second semiconductor chip.

The transmission line 35 comprises a ball land 35a, a conductive via 35b, a wire portion 35c and a free end 35d, similarly to the ball land 34a, the conductive via 34b, the wire portion 34c and the free end 34d of the transmission line 34.

As apparent from FIGS. 1 and 2, the second semiconductor chip 40 is mounted on the second tape 30 through another elastomer sheet 80 serving as a shock absorber or buffer. On the peripherals of the second semiconductor chip 40, another resin protector 90 is provided, as shown in FIG. 2.

Figure 3:
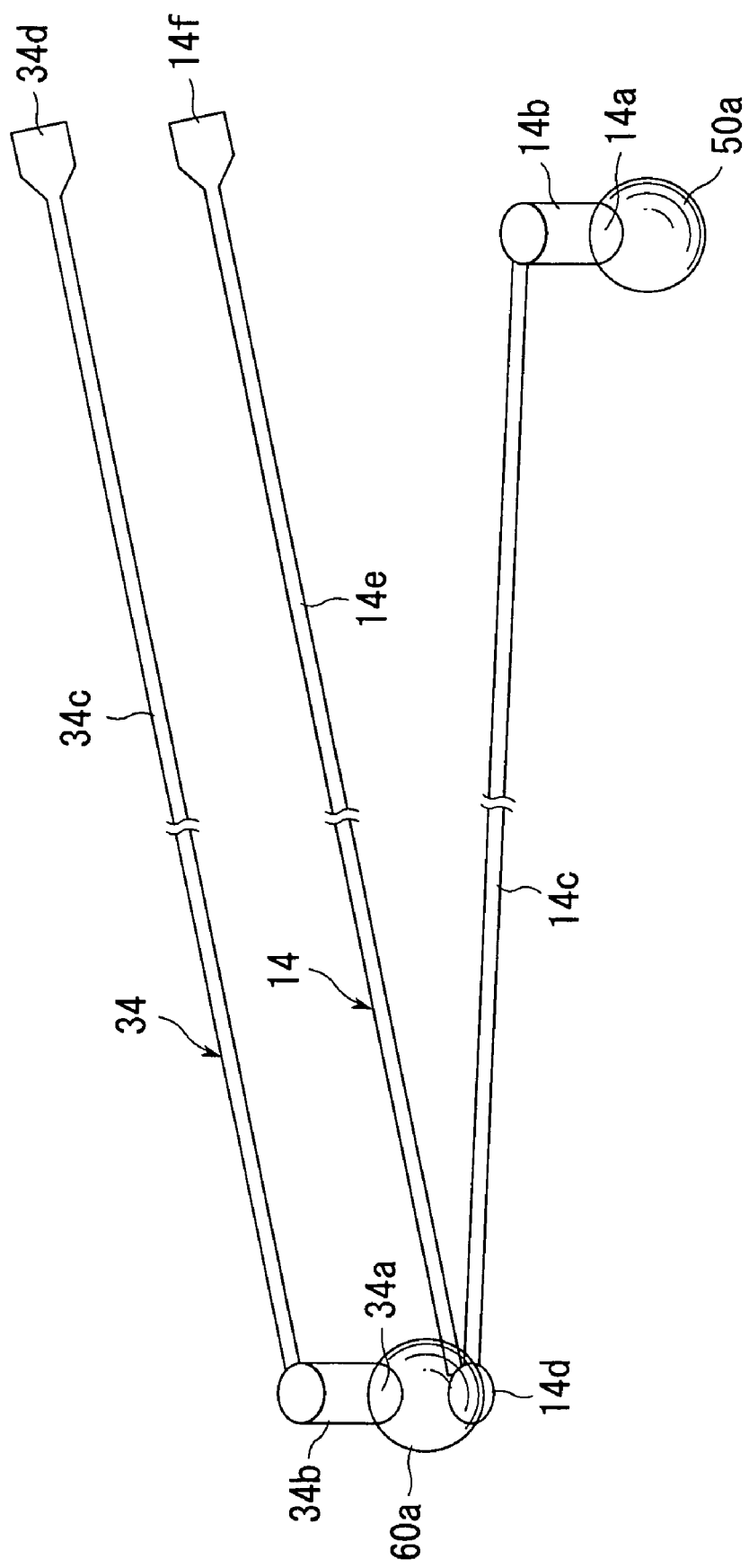
FIG. 3 is a schematic view showing electric lengths of signal transmission paths.

As best shown in FIG. 3, the first path portions (14e, 15e) and the second path portions (34, 60a; 35, 60b) are branched off from the common path portions (14a, 14b, 14c; 15a, 15b, 15c). In this embodiment, the actual lengths of the wire portions 34c, 35c of the second tape 30 are designed equal to the actual lengths of the wire portions 14e, 15e, respectively. Therefore, the electric lengths of the first signal transmission paths from the solder balls 50a, 50b to the first semiconductor chip 20 are substantially equal to the electric length of the second signal transmission paths, respectively.

In the present embodiment, each of the first and the second tapes 10, 30 has a plurality of signal transmission lines, as mentioned above. The signal transmission lines include DQ signal lines and Command/Address (C/A) signal lines. In this embodiment, every DQ signal line has a feature similar to the first or the second signal transmission path, wherein the electric path to the first semiconductor chip 20 is substantially equal to the electric path to the second semiconductor chip 40. On the other hand, the C/A signal lines have not such features because of the signal rate different from that of the DQ line, wherein the electric path to the first semiconductor chip 20 is different from the electric path to the second semiconductor chip 40. However, the C/A signal lines may have a feature similar to the first or the second signal transmission path.

Figure 4:
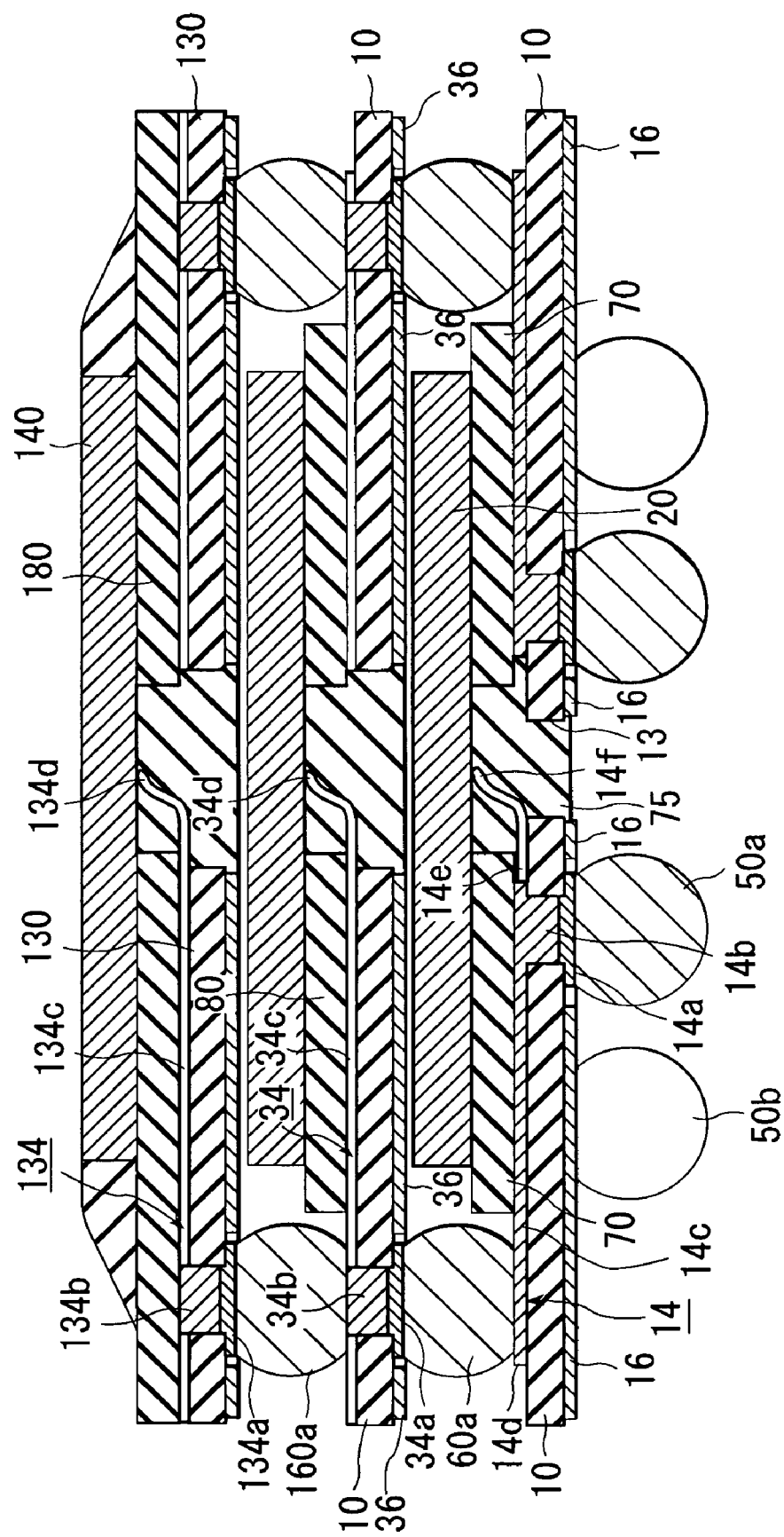
FIG. 4 is a cross-sectional view schematically showing a modification of the stacked-type semiconductor package of FIG. 1, wherein three semiconductor chips are stacked in a semiconductor package, and some components, especially right-side components are not shown for the sake of clarity.

Although the stacked-type semiconductor package according to the above-described embodiment comprises two semiconductor chips 20, 40, the present invention is not limited thereto but may be applied to a stacked-type semiconductor package comprising three or more semiconductor chips. In FIG. 4, there is shown a stacked-type semiconductor package into which three semiconductor chips are stacked. The stacked-type semiconductor package of FIG. 4 comprises additional solder balls 160*a*, a third tape 130, a third elastomer sheet 180 and a third semiconductor chip 140, in addition to the components of the stacked-type semiconductor package of FIG. 2. The third tape 130 is formed with transmission lines each of which comprises a conductive via 134*b* and a wire portion 134*c*. The conductive via 134*b* is connected to the additional solder ball 160*a*. The third semiconductor chip 140 is mounted on the third tape 130 through the third elastomer sheet 180 and is connected to the wire portion 134*c*. The additional solder ball 160*a* and the transmission line comprised of the conductive via 134*b* and the wire portion 134*c* constitute a third path portion which is used only as a part of a third signal transmission path to the third semiconductor chip. The wire portion 134*c* may have the same length of the wire portion 34*c*, and the third path portion may have the electric length substantially equal to that of the second path portion.

The preferred embodiments of the present invention will be better understood by those skilled in the art by reference to the above description and figures. The description and preferred embodiments of this invention illustrated in the figures are not to intend to be exhaustive or to limit the invention to the precise form disclosed. They are chosen to describe or to best explain the principles of the invention and its applicable and practical use to thereby enable others skilled in the art to best utilize the invention.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. A stacked semiconductor chip module comprising:
    a first substrate of insulating material having a first and second major surface, said first substrate being formed with: external connection terminals arranged on said second major surface; a first semiconductor chip secured on an inner area of said first major surface; first connection points arranged on an outer area of said first major surface; first conduction lines electrically connecting said first connection points with the corresponding external connection terminals, respectively; and second conduction lines formed on said first major surface so as to electrically connect said first connection points with corresponding electrodes formed on said first semiconductor chip, respectively;
    a second substrate of insulating material closely spacedly stacked on said first substrate, said second substrate being formed with: a second semiconductor chip secured on an inner area of a major surface of the second substrate; second connection points arranged on an outer area of said major surface of the second substrate; and third conduction lines formed on said major surface of the second substrate so as to electrically connect said second connection points with corresponding electrodes formed on said second semiconductor chip, respectively; and
    interconnection members disposed between said first and second substrates so as to electrically connect the first and second substrates so as to electrically connects the first connection points with the corresponding second connection points, respectively,
    wherein electrical signals applied to said external connection terminals are transmitted through the corresponding first conduction lines to the corresponding first connection points, respectively,
    wherein the electrical signals are diverged at said first connection points, one of which are transmitted to said first semiconductor chip via said second conduction lines, another of which are transmitted to said second semiconductor chip via said interconnection members, said second connection points and said third conduction lines, respectively,
    wherein at each signal path a path between the first connection point and the end portion of the second conduction line which is connected to the corresponding electrode on the first semiconductor chip has an electric length substantially equal to that of a path between the second connection point and that end portion of the third conduction line which is connected to the corresponding electrode on the second semiconductor chip.

* * * * *